(12) United States Patent
Hudgens et al.

(10) Patent No.: US 9,325,228 B2
(45) Date of Patent: Apr. 26, 2016

(54) MULTI-AXIS ROBOT APPARATUS WITH UNEQUAL LENGTH FOREARMS, ELECTRONIC DEVICE MANUFACTURING SYSTEMS, AND METHODS FOR TRANSPORTING SUBSTRATES IN ELECTRONIC DEVICE MANUFACTURING

(71) Applicant: Applied Materials, Inc., Santa Clara, CA (US)

(72) Inventors: Jeffrey C. Hudgens, San Francisco, CA (US); Izya Kremerman, Los Gatos, CA (US); Jeffrey A. Brodine, Los Gatos, CA (US); Damon Keith Cox, Round Rock, TX (US)

(73) Assignee: Applied Materials, Inc., Santa Clara, CA (US)

( * ) Notice: Subject to any disclaimer, the term of this patent is extended or adjusted under 35 U.S.C. 154(b) by 111 days.

(21) Appl. No.: 14/090,899

(22) Filed: Nov. 26, 2013

(65) Prior Publication Data
US 2014/0154038 A1  Jun. 5, 2014

Related U.S. Application Data

(60) Provisional application No. 61/732,196, filed on Nov. 30, 2012.

(51) Int. Cl.
*H01L 21/677* (2006.01)
*H02K 16/00* (2006.01)
(Continued)

(52) U.S. Cl.
CPC ............ *H02K 16/00* (2013.01); *B25J 9/042* (2013.01); *B25J 9/126* (2013.01); *B25J 11/0095* (2013.01);
(Continued)

(58) Field of Classification Search
CPC ..... H02K 5/128; H02K 2213/12; B25J 9/042; B25J 9/126; B25J 9/043; B25J 18/00
USPC ........................................ 414/744.5
See application file for complete search history.

(56) References Cited

U.S. PATENT DOCUMENTS

| | | |
|---|---|---|
| 5,046,992 A | 9/1991 | Tamai et al. |
| 5,314,294 A | 5/1994 | Taniguchi et al. |

(Continued)

FOREIGN PATENT DOCUMENTS

| | | |
|---|---|---|
| JP | 11-215780 | 8/1999 |
| JP | 2000-069741 | 3/2000 |

OTHER PUBLICATIONS

Hudgens et al., U.S. Appl. No. 13/923,741, titled: Boom Drive Apparatus, Multi-Arm Robot Apparatus, Electronic Device Processing Systems, and Methods for Transporting Substrates in Electronic Device Manufacturing Systems, filed Jun. 21, 2013.

(Continued)

*Primary Examiner* — Ernesto Suarez
*Assistant Examiner* — Ronald Jarrett
(74) *Attorney, Agent, or Firm* — Dugan & Dugan, PC

(57) ABSTRACT

Embodiments include multi-arm robots for substrate transport systems that include a boom, first and second forearms rotationally coupled to the boom, the second forearm being shorter than the first forearm, a first wrist member rotationally coupled to the first forearm, and a second wrist member rotationally coupled to the second forearm. Each of the boom, first and second forearms, and the first and second wrist members are configured to be independently rotated to carry out substrate motion profiles. Electronic device processing systems and methods of transporting substrates are described, as are numerous other aspects.

20 Claims, 12 Drawing Sheets

(51) Int. Cl.
  *B25J 11/00* (2006.01)
  *B25J 9/04* (2006.01)
  *B25J 9/12* (2006.01)
  *H02K 5/128* (2006.01)

(52) U.S. Cl.
  CPC .... *H01L 21/67703* (2013.01); *H01L 21/67742* (2013.01); *H02K 5/128* (2013.01); *H02K 2213/12* (2013.01); *Y10S 901/23* (2013.01); *Y10T 29/49009* (2015.01); *Y10T 74/20317* (2015.01)

(56) References Cited

U.S. PATENT DOCUMENTS

| | | | |
|---|---|---|---|
| 6,105,454 | A | 8/2000 | Bacchi et al. |
| 6,485,250 | B2 | 11/2002 | Hofmeister |
| 6,543,306 | B1 | 4/2003 | WakaBayashi et al. |
| 6,669,434 | B2 * | 12/2003 | Namba et al. ............. 414/744.5 |
| 6,737,826 | B2 | 5/2004 | Gilchrist |
| 6,799,939 | B2 | 10/2004 | Lowrance et al. |
| 7,688,017 | B2 | 3/2010 | Hudgens |
| 7,891,935 | B2 * | 2/2011 | Kremerman ............. 414/744.5 |
| 2004/0001750 | A1 | 1/2004 | Kremerman |
| 2005/0079042 | A1 | 4/2005 | Maeda |
| 2006/0245905 | A1 | 11/2006 | Hudgens |
| 2007/0116549 | A1 | 5/2007 | Rice et al. |
| 2008/0063504 | A1 | 3/2008 | Kroetz et al. |
| 2008/0298945 | A1 | 12/2008 | Cox et al. |
| 2010/0178135 | A1 | 7/2010 | Laceky et al. |
| 2010/0178146 | A1 | 7/2010 | Kremerman et al. |
| 2010/0178147 | A1 | 7/2010 | Kremerman et al. |
| 2013/0039726 | A1 | 2/2013 | Brodine et al. |
| 2013/0115028 | A1 | 5/2013 | Kremerman et al. |
| 2013/0121798 | A1 * | 5/2013 | Hosek ...................... 414/744.5 |
| 2013/0149076 | A1 | 6/2013 | Cox et al. |

OTHER PUBLICATIONS

Kremerman, U.S. Appl. No. 14/090,929, titled: Motor Modules, Multi-Axis Motor Drive Assemblies, Multi-Axis Robot Apparatus, and Electronic Device Manufacturing Systems and Methods, filed Nov. 26, 2013.

International Search Report and Written Opinion of International Application No. PCT/US2013/072048 mailed Mar. 4, 2014.

International Search Report and Written Opinion of International Application No. PCT/US2013/072053 mailed Mar. 5, 2014.

International Preliminary Report on Patentability of International Application No. PCT/US2013/072053 mailed Jun. 11, 2015.

International Preliminary Report on Patentability of International Application No. PCT/US2013/072048 mailed Jun. 11, 2015.

\* cited by examiner

MULTI-AXIS ROBOT APPARATUS WITH UNEQUAL LENGTH FOREARMS, ELECTRONIC DEVICE MANUFACTURING SYSTEMS, AND METHODS FOR TRANSPORTING SUBSTRATES IN ELECTRONIC DEVICE MANUFACTURING

RELATED APPLICATIONS

The present application claims priority to U.S. Provisional Application 61/732,196 filed Nov. 30, 2012, and entitled "MULTI-AXIS ROBOT APPARATUS WITH UNEQUAL LENGTH FOREARMS, ELECTRONIC DEVICE MANUFACTURING SYSTEMS, AND METHODS FOR TRANSPORTING SUBSTRATES IN ELECTRONIC DEVICE MANUFACTURING" which is hereby incorporated herein for all purposes.

The present application is also related to U.S. patent application Ser. No. 14/090,929 filed on Nov. 26, 2013, and entitled "MOTOR MODULES, MULTI-AXIS MOTOR DRIVE ASSEMBLIES, MULTI-AXIS ROBOT APPARATUS, AND ELECTRONIC DEVICE MANUFACTURING SYSTEMS AND METHODS" which is hereby incorporated herein for all purposes.

FIELD

The present invention relates to electronic device manufacturing, and more specifically to apparatus, systems, and methods for transporting substrates.

BACKGROUND

Conventional electronic device manufacturing systems may include multiple process chambers and one or more load lock chambers. Such chambers may be included in cluster tools where a plurality of chambers may be distributed about a transfer chamber, for example. These systems and tools may employ a transfer robot, which may be housed in the transfer chamber for example, and is adapted to transport substrates between the various chambers and one or more load lock chambers. For example, the transfer robot may transport substrates from process chamber to process chamber, from load lock chamber to process chamber, and vice versa. Rapid and precise transport of substrates between the various chambers may provide efficient system throughput, thereby lowering overall operating costs.

Accordingly, systems, apparatus, and methods for efficient and precise movement of substrates are desired.

SUMMARY

In one aspect a multi-axis robot is provided. The multi-axis robot includes a boom adapted to rotate about a first rotational axis; a first forearm rotationally coupled to the boom at an outboard end of the boom and the first forearm is configured to be independently rotated about a second rotational axis; a second forearm rotationally coupled to the boom at the outboard end of the boom and configured to be independently rotated about the second rotational axis, the second forearm being shorter than the first forearm; a first wrist member rotationally coupled to the first forearm at a first outer location of the first forearm and configured to be independently rotated relative to the first forearm about a third axis; and a second wrist member rotationally coupled to the second forearm at the second outer location and configured to be independently rotated relative to the second forearm about a fourth axis.

In another aspect an electronic device processing system is provided. The electronic device processing system includes a transfer chamber; a multi-link robot apparatus at least partially received in the transfer chamber, the multi-link robot apparatus having a boom adapted to rotate about a first rotational axis; a first forearm rotationally coupled to the boom at an outboard end of the boom and configured to be independently rotated; a second forearm rotationally coupled to the boom at the outboard end of the boom and configured to be independently rotated, the second forearm being shorter than the first forearm; a first wrist member rotationally coupled to the first forearm and configured to be independently rotated relative to the first forearm; and a second wrist member rotationally coupled to the second forearm and configured to be independently rotated relative to the second forearm.

In another aspect, a method of transporting substrates within an electronic device processing system is provided. The method includes providing a boom adapted to rotate about a first rotational axis; providing a first forearm rotationally coupled to the boom at an outboard end of the boom; providing a second forearm rotationally coupled to the boom at the outboard end of the boom, the second forearm being shorter than the first forearm; providing a first wrist member rotationally coupled to the first forearm at an outer location of the first forearm; providing a second wrist member rotationally coupled to the second forearm at an outer location of the second forearm; and independently rotating the first forearm, second forearm, first wrist member, and second wrist member to transport substrates from chamber to chamber and moving the second forearm overtop the first forearm during the transport.

Numerous other aspects are provided in accordance with these and other embodiments of the invention. Other features and aspects of embodiments of the present invention will become more fully apparent from the following detailed description, the appended claims, and the accompanying drawings.

DETAILED DESCRIPTION

Figure 1A:
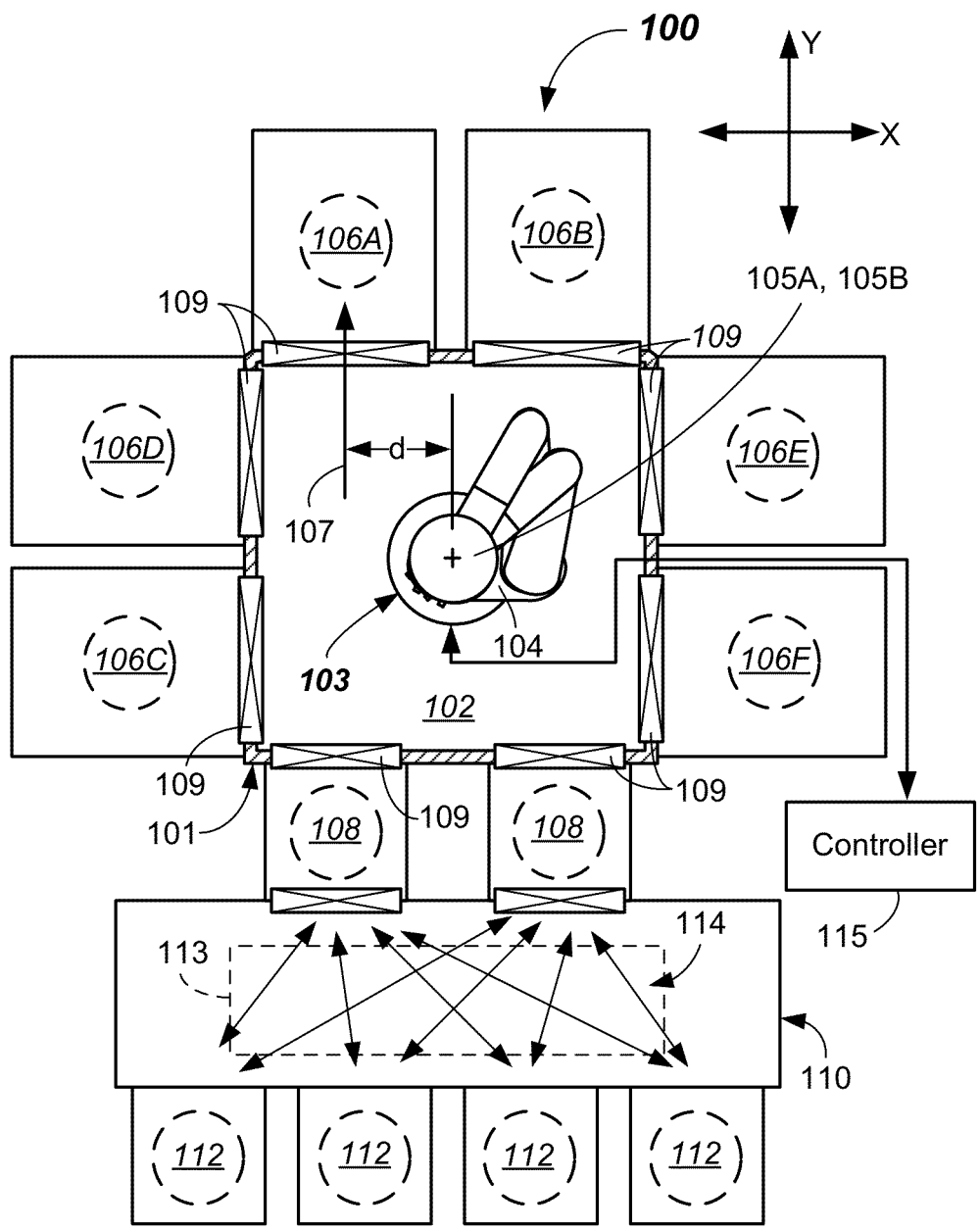
FIG. 1A illustrates a schematic top view of an electronic device processing system including a multi-axis robot apparatus according to some embodiments.

Electronic device manufacturing may require very precise and rapid transport of substrates between various locations. In particular, in some embodiments, dual end effectors (sometimes referred to as "blades") may be attached to the robot apparatus and may be adapted to transport substrates resting upon the end effectors to and from chambers of an electronic device processing system. Such systems may include multi-axis robots arranged in a transfer chamber with end effectors having an over/under configuration. This allows a first substrate to be extracted from a chamber, and then be immediately replaced at the same chamber with a second wafer. The goal is to achieve this transfer as rapidly as possible. However, existing multi-axis robots may not be able to make the transfer without substantial other robot moves. These additional moves may increase the overall transfer speed that is possible. Moreover, exiting robots may be limited in the way in which they can access such chambers. For example, some existing robots may only enter into facets in a radial direction, where the radial direction is aligned with a center of the transfer chamber (e.g., and a shoulder axis of a selective compliance assembly robot arm (SCARA) robot. However, to increase the number of available process chambers, eight-faceted systems may be used. For example, six process chambers and two load locks may be arranged about the transfer chamber. However, the entry into the various facets can be positioned off axis from the center of the transfer chamber. In other words, a vector along a direction of travel of the end effector into the chamber is offset from the center of the transfer chamber. Accordingly, conventional robots may not be suitable for use.

Therefore, in one or more embodiments, a multi-axis robot apparatus that can be used for transporting substrates to and from chambers in electronic device manufacturing can be provided.

According to one or more embodiments of the invention, a multi-axis robot apparatus includes a boom having first and second forearms attached at an outboard end. Each forearm has a wrist member coupled thereto at outer locations thereof. The wrist members have end effectors coupled to them or formed integral therewith. Substrates to be swapped may rest on one or both of the end effectors when in use. According to some embodiments, each of the forearms and wrist members may be independently controlled, allowing a large degree to flexibility to the possible motion paths achievable as the substrates are being swapped. Further, the use of only a forearm and a wrist member for each end effector reduces the number of components and joints, and therefore may add rigidity.

In another broad aspect, the forearms may have unequal lengths. In particular, the lengths may be such that the shorter forearm may pass by the wrist joint connecting the longer forearm to its wrist member. This differential length allows enhanced motion path capability of the robot and therefore an improved substrate exchange ability. The combination of (1) independent motion capability of the first and second forearms and (2) first and second wrist members with unequal length forearms together provides extremely flexible motion path capability. In particular, the ability to service off-axis chambers is provided.

According to one or more embodiments of the invention, electronic device processing systems including the multi-axis robot apparatus are provided. According to one or more additional embodiments of the invention, methods of transferring substrates with an electronic device processing system are provided. Further details of example embodiments of the invention are described with reference to FIGS. 1A-8 herein.

Figure 1B:
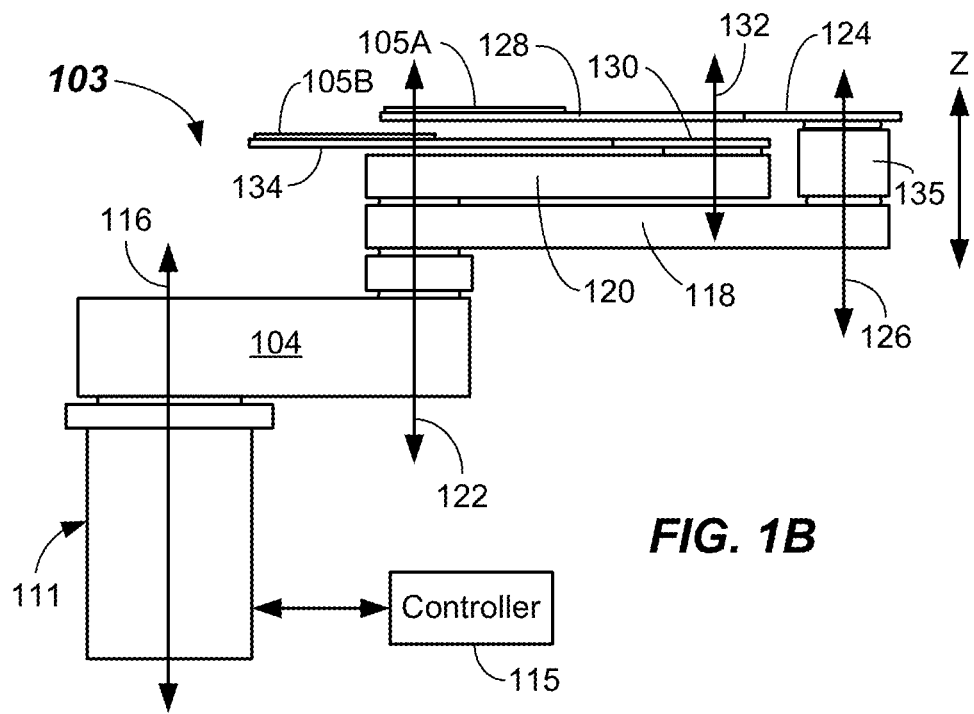
FIG. 1B illustrates a side view of a multi-axis robot apparatus according to some embodiments.
Figure 1C:
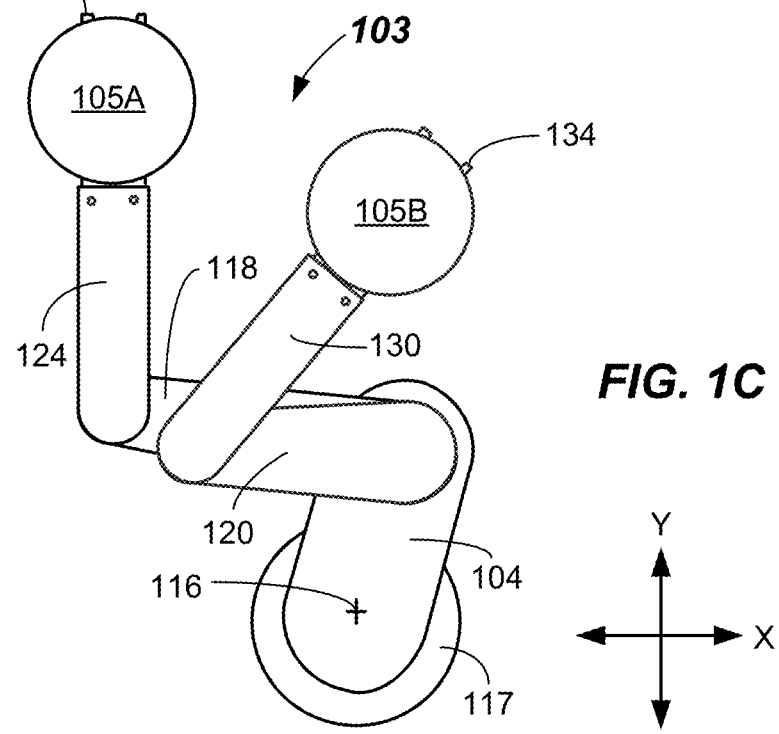
FIG. 1C illustrates a top view of a multi-axis robot apparatus according to some embodiments.
Figure 1D:
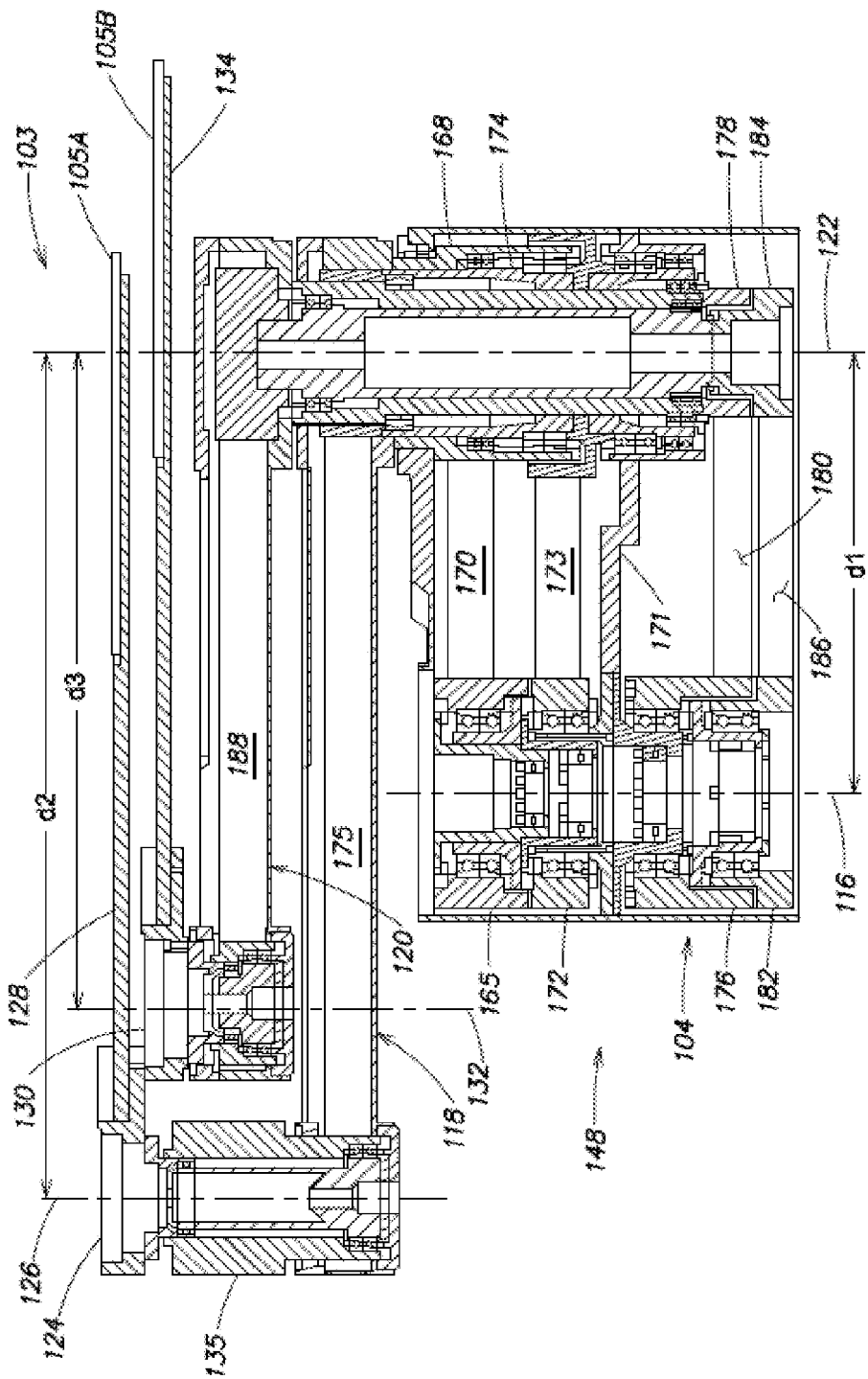
FIG. 1D illustrates a cross-sectioned side view of a multi-axis robot apparatus according to some embodiments.

FIG. 1A is a schematic diagram of an example embodiment of an electronic device processing system 100 according to embodiments of the present invention. The electronic device processing system 100 may include a housing 101 having walls defining a transfer chamber 102. A multi-axis robot apparatus 103 in accordance with another embodiment of the invention may be at least partially housed within the transfer chamber 102. Additional views of the multi-axis robot are shown in FIGS. 1B-1D. The multi-axis robot apparatus 103 may be adapted to place or extract substrates (e.g., substrates 105A, 105B) to and from destinations via operation of multi-axis robot apparatus 103, which is described fully below herein.

The destinations may be various process chambers (e.g., process chambers 106A, 106B, 106C, 106D, 106E, 106F) that are coupled to the transfer chamber 102. Optionally, the destinations may be one or more load lock chambers 108, which may be coupled to the transfer chamber 102. Process chambers 106A-106F may be adapted to carry out any number of process steps, such as deposition, oxidation, nitration, etching, polishing, cleaning, lithography, or the like. Other processes may also be carried out therein. The load lock chambers 108 may be adapted to interface with a factory interface 110, which may receive one or more substrates from substrate carriers 112 docked at load ports of the factory interface 110. Substrates may be transferred by a robot 113 (shown dotted) in the factory interface 110 and the transfer may take place in any sequence or direction as indicated by arrows 114. Substrates as used herein shall mean articles used to make electronic devices or circuit components, such as silica-containing wafers, glass plates, glass panels, masks, or the like.

Figure 2A:
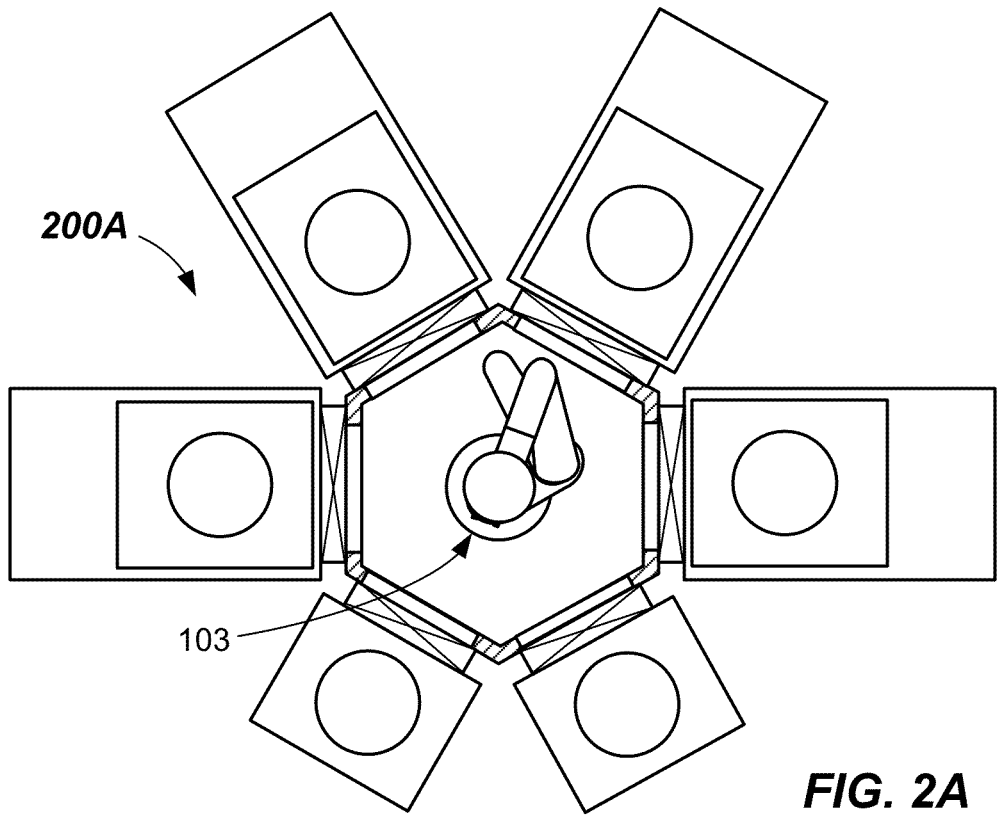
FIG. 2A illustrates a partial cross-sectioned top view of a multi-axis robot apparatus installed in a six-faceted mainframe housing according to some embodiments.
Figure 2B:
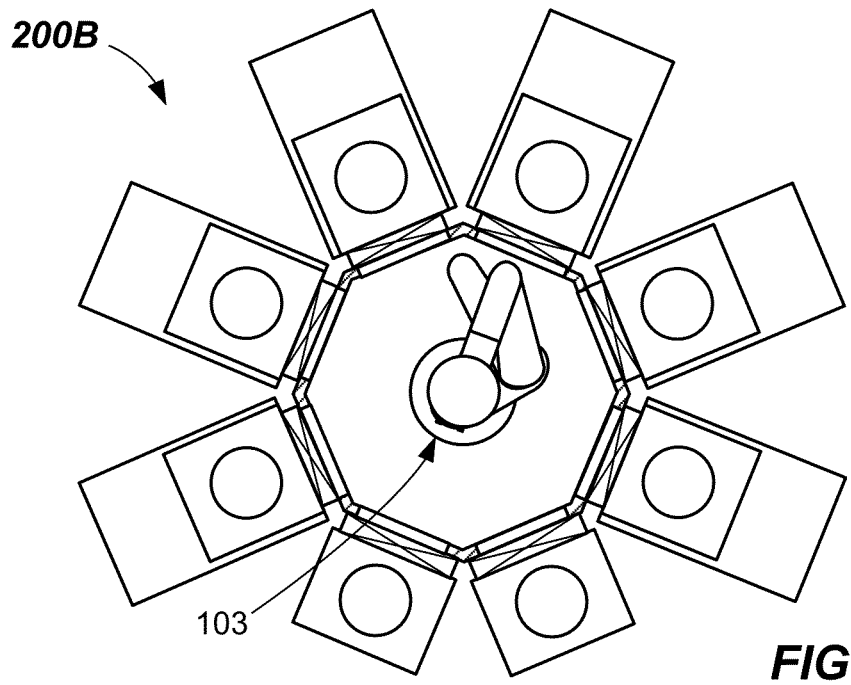
FIG. 2B illustrates a partial cross-sectioned top view of a multi-axis robot apparatus installed in an eight-faceted mainframe housing according to some embodiments.

Configurations of twin chambers (e.g., side-by-side chambers having parallel facets) are shown in FIG. 1A, and the robot apparatus 103 is especially adept at servicing such chambers having entry directions that are offset from the center of the transfer chamber 102, angularly offset from a radially extending line from the center of the transfer chamber 102, and/or offset from the shoulder axis of the robot 103. For example, vector 107 illustrates a direction of normal entry (e.g., perpendicular to the facet) into process chamber 106A, and that vector 107 is offset laterally by a distance d from the center of the transfer chamber 102, and also the shoulder axis of the robot apparatus in this embodiment. However, it should be recognized that the multi-axis robot 103 described herein has utility for use in transferring substrates in other tools having different mainframe configurations, such as the mainframe configuration of electronic device processing system 200A having four process chambers and two load lock chambers in FIG. 2A, and the electronic device processing system 200B of FIG. 2B having six process chambers and two load lock chambers as shown in FIG. 2B. In each of these two embodiments, the facets are radially oriented in that a vector normal to any facet is directed through the shoulder axis of the robot and the center of the transfer chamber. Use of the robot 103 in these embodiments allows any number of prepositioning moves to be made. This allows a first substrate that has been removed from one chamber on a first end effector to be prepositioned next to another chamber when a second substrate positioned on a second end effector is put (e.g., placed) into the chamber that was vacated by the first substrate. These prepositioning moves increase throughput.

Referring back to FIG. 1A, in some embodiments, the transfer chamber 102 may be operated under a vacuum, for example. Each of the process chambers 106A-106F and the one or more load lock chambers 108 may include slit valves 109 at their ingress/egress, which may be adapted to open and close when placing or extracting substrates 105A-105B to and from process chambers 106A-106F and/or one or more load lock chambers 108. Slit valves 109 may be of any suitable conventional construction.

The motion of the various components of the multi-axis robot apparatus 103 may be controlled by suitable commands to a drive assembly 111 containing a plurality of drive motors of the multi-axis robot apparatus 103 from a controller 115. Signals from the controller 115 may cause motion of the various components of the multi-axis robot apparatus 103 as will be apparent from the following. Suitable feedback may be provided for each component by various sensors, such as position encoders, or the like.

Now referring to FIGS. 1A-1D, the multi-axis robot apparatus 103 includes a boom 104 rotatable about a primary axis 116. The multi-axis robot apparatus 103 may include a base 117 that is adapted to be attached to a wall (e.g., a floor) of the housing 101. However, the multi-axis robot apparatus 103 may be attached to a ceiling of the housing 101 in some embodiments. Accordingly, the multi-axis robot apparatus 103 may be at least partially supported by the housing 101. The multi-axis robot apparatus 103 also includes a drive assembly 111 that is configured and adapted to drive the boom 104 and various arms to be described. The boom 104 may be adapted to be rotated about the first rotational axis 116 in either a clockwise or counterclockwise rotational direction. The rotation may be provided by any suitable drive motor, such as a conventional variable reluctance or permanent magnet electric motor to be described further herein below. The rotation of the boom 104 may be controlled by suitable commands to the drive motor from the controller 115. Boom 104 is adapted to be rotated in an X-Y plane relative to the base 117 about the first rotational axis 116.

In the depicted embodiment, the robot apparatus 103 includes first forearm 118 and second forearm 120, which may coupled to the boom 104 at a radially outboard end of the boom 104 spaced from the first rotational axis 116. In the depicted embodiment, the first and second forearms 118, 120 are each mounted to a first outboard end of the boom 104 at the same outboard location and are commonly rotatable about a second rotational axis 122. As shown, the second forearm 120 is shorter than the first forearm 118. Each of the first and second forearms 118, 120 is independently rotatable relative to the boom 104. Rotation may be about +/−150 degrees. In the depicted embodiment, the second rotational axis 122 may be spaced from the first rotational axis 116 by a distance d1 of between about 348 cm and about 522 cm (See FIG. 1D). d1 is a center-to-center length of the boom 104.

Furthermore, a first wrist member 124 may be coupled to a first outer location on the first forearm 118 and is independently rotatable relative to the first forearm 118 about a first wrist axis 126. The first wrist axis 126 may be spaced from the second rotational axis 122 by a distance d2 of between about 670 cm and about 1004 cm (See FIG. 1D). d2 is a first center-to-center length of the first forearm 118. The first wrist member 124 may have a first end effector 128 coupled thereto. First end effector 128 that is adapted to carry the substrate 105A to be processed within the substrate processing system 100. Rotation may be about +/−150 degrees.

A second wrist member 130 may be coupled to a second outer location on the second forearm 120 and rotatable about a second wrist axis 132. The second wrist axis 132 may be spaced from the second rotational axis 122 by a distance d3 of between about 514 cm and about 772 cm (See FIG. 1D). d3 is the second center-to-center length of the second forearm 120. The second center-to center length d3 may be less than 90% of the first center-to center length d2, and between about 50% and about 90% of the first center-to center length d2 in some embodiments. In some embodiments, the center-to-center length d1 of the boom 104 is shorter than a first center-to-center length d2 of the first forearm 118. In some embodiments, the center-to-center length d1 of the boom 104 is shorter than a second center-to-center length d3 of the second forearm 120.

The second wrist member 130 may have a second end effector 134 coupled thereto. Second end effector 134 is adapted to carry the substrate 105B to be processed within the substrate processing system 100. Second wrist member 130 is independently rotatable relative to the second forearm 120. Rotation may be about +/−150 degrees. As can be seen in FIG. 1B, the second forearm 120 and second wrist member 130 and second end effector 128 are configured so that they are vertically spaced apart. In particular, a wrist spacer 135 spaces the first forearm 118 vertically from the first wrist member 124, and the shorter length of the second forearm 120 together allows the second forearm 120 and the second wrist member 130 and attached second end effector 134 to pass between the first forearm 118 and the first wrist member 124 and past the wrist spacer 135 without interference with the wrist joint.

Coupling this feature with the independent rotation capability of the boom 104, each of the first and second forearms 118, 120, and each of the first and second wrist members 124, 130, provides extreme flexibility in carrying out any desired motion path of the substrates 105A, 105B.

In the depicted embodiment of FIG. 1A, the robot apparatus 103 is shown located and housed in a transfer chamber 102. However, it should be recognized that this embodiment of robot apparatus 103, as well as the other robot apparatus described herein, may be used in other areas of electronic device manufacturing, such as in a factory interface 110 wherein the robot apparatus may transport substrates or even substrate carriers 112 between load ports and the one or more load lock chambers 108 of the processing system 100, for example.

Figure 1E:
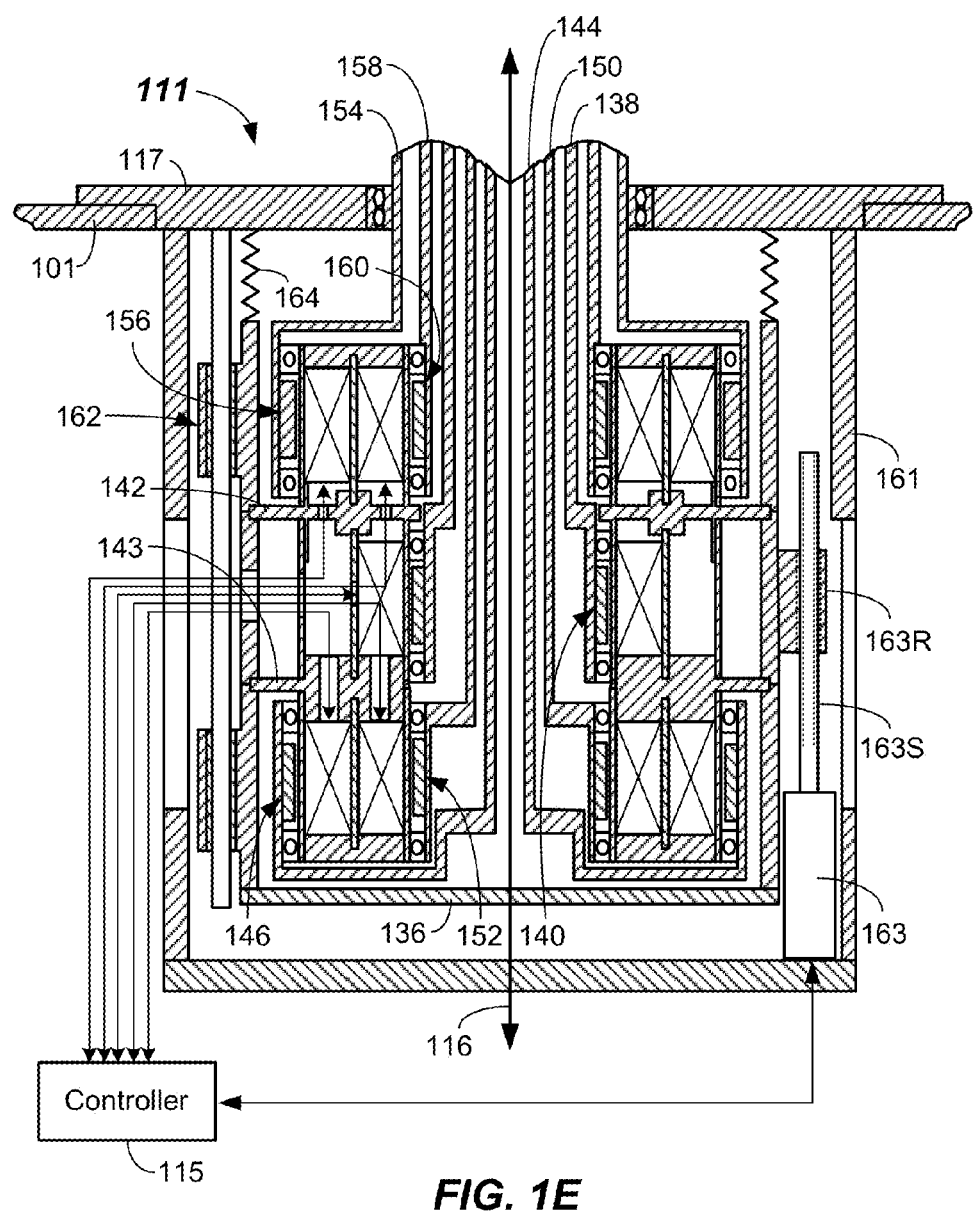
FIG. 1E illustrates a cross-sectioned side view of a drive assembly of a multi-axis robot apparatus according to some embodiments.

The drive assembly 111 for accomplishing independent rotation of each of the boom 104, first and second forearms 118, 120, and first and second wrist members 124, 130 will now be described in detail. The drive assembly 111 includes, as best shown in FIG. 1E, a motor housing 136 adapted to contain the various drive motor components. First, the drive assembly 111 may include drive components adapted to independently rotate the boom 104 about the first rotational axis 116. Rotation may be about +/−360 degrees or more. A first drive shaft 138 may extend from the boom 104 and may be supported by suitable bearings. First drive shaft 138 is adapted to be rotated by a first drive motor 140. First drive motor 140 may be an electrical motor including a first rotor and first stator, for example. First rotor may be a magnet and may be coupled to the first drive shaft 138. First stator may be secured to or supported between an upper bulkhead 142 and a lower bulkhead 143. Suitable conventional rotational encoders (not shown) may be used to position the boom 104 as desired.

Further, the drive assembly 111 may include drive components adapted to independently rotate the first forearm 118 about the second rotational axis 122 located at an outboard end of the boom 104. Rotation may be about +/−150 degrees in some embodiments. The drive components may include a second drive shaft 144 and a second drive motor 146. Rotation of the second drive motor 146 causes rotation of the second drive shaft 144 and drives the coupled first forearm 118 about the second rotational axis 122. The second drive motor 146 may be an electrical motor including a second rotor and second stator. The second drive shaft 144 may extend from a boom drive system 148 described herein (FIG. 1D), and may be supported by suitable bearings. Driving the second drive motor 146 via drive signals from the controller 115 causes independent rotation of the first forearm 118 relative to the boom 104. Suitable conventional rotational encoders (not shown) may be used to position the first forearm 118 relative to the boom 104 as desired. Second stator may be secured to, or supported by, the lower bulkhead 143. Upper and lower bulkheads 142, 143 may be secured to, or part of, the motor housing 136.

Drive assembly 111 may also include drive components adapted to independently rotate the first wrist member 124 about the first wrist axis 126 located at an outer location on the first forearm 118. Rotation may be about +/−150 degrees in some embodiments. The drive components may include a third drive shaft 150 and a third drive motor 152. Rotation of the third drive motor 152 causes rotation of the third drive shaft 150 and drives the coupled first wrist member 124 about the first wrist axis 126. The third drive motor 152 may be an electrical motor including a third rotor and third stator. The third drive shaft 150 may extend from the boom drive system 148 (FIG. 1D), and may be supported by suitable bearings. Third drive motor 152 may be driven via drive signals from the controller 115 to cause independent rotation of the first wrist member 124 about the first wrist axis 126 relative to the first forearm 118. Suitable conventional rotational encoders (not shown) may be used to position the first wrist member 124 relative to the first forearm 118 as desired. Third stator may be secured to, or supported by, the lower bulkhead 143.

Furthermore, the drive assembly 111 may include drive components adapted to independently rotate the second forearm 120 about the second rotational axis 122 located at an outboard end of the boom 104. Rotation may be about +/−150 degrees in some embodiments. The drive components may include a fourth drive shaft 158 and a fourth drive motor 160.

Rotation of the fourth drive motor 160 causes a rotation of the fourth drive shaft 158 and drives the coupled second forearm 120 about the second rotational axis 122. The fourth drive motor 160 may be an electrical motor including a fourth rotor and fourth stator. The fourth drive shaft 158 may extend from a boom drive system 148 (FIG. 1D), and may be supported by suitable bearings. Driving the fourth drive motor 160 via drive signals from the controller 115 causes independent rotation of the second forearm 120 about the second rotational axis 122 relative to the boom 104. Suitable conventional rotational encoders (not shown) may be used to position the second forearm 120 relative to the boom 104 as desired. Fourth stator may be secured to, or supported by the upper bulkhead 142.

Drive assembly 111 may also include drive components adapted to independently rotate the second wrist member 130 about the second wrist axis 132 located at an outer location on the second forearm 120. Rotation may be about +/−150 degrees in some embodiments. The drive components may include a fifth drive shaft 154 and a fifth drive motor 156. Rotation of the fifth drive motor 156 causes rotation of the fifth drive shaft 154 and drives the coupled second wrist member 130 about the second wrist axis 132. The fifth drive motor 156 may be an electrical motor including a fifth rotor and fifth stator. The fifth drive shaft 154 may extend from the boom drive system 148 (FIG. 1D), and may be supported by suitable bearings. Fifth drive motor 156 may be driven via drive signals from the controller 115 to cause independent rotation of the second wrist member 130 relative to the second forearm 120. Suitable conventional rotational encoders (not shown) may be used to position the second wrist member 130 relative to the second forearm 120 as desired. Fifth stator may be secured to, or supported by, the upper bulkhead 142.

Figure 8:
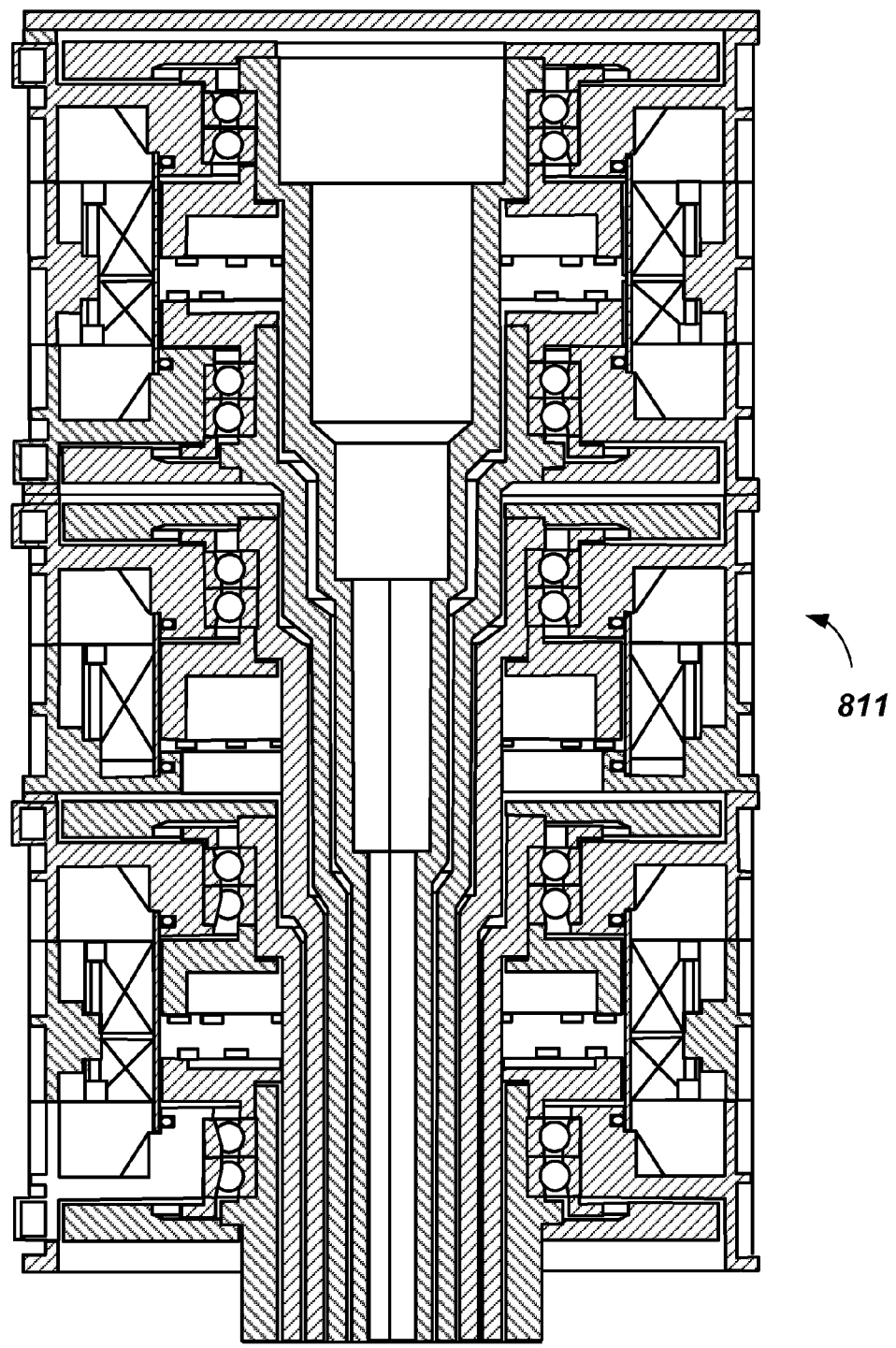
FIG. 8 illustrates a cross-sectioned side view of another drive assembly of a multi-axis robot apparatus according to some embodiments.

Additionally, the drive assembly 111 may include Z-axis motion capability. In particular, the motor housing 136 may be restrained from rotation relative to an outer casing 161 by a motion restrictor 162. Motion restrictor 162 may be two or more linear bearings or other bearing or slide mechanisms that function to constrain rotation of the motor housing 136 relative to the outer casing 161, yet allow Z-axis motion of the motor housing 136 (along the direction of the first rotational axis 116). The vertical motion is provided by a vertical motor 163. Rotation of the vertical motor 163 may operate to rotate a lead screw 163S in receiver 163R coupled to or integral with motor housing 136. This vertically translates the motor housing 136, and thus the connected boom 104, forearms 118, 120, wrist members 124, 130, end effectors 128, 134, and, thus, the substrates 105A, 105B. A suitable seal 164 may seal between the motor housing 136 and the base 117 thereby accommodating the vertical motion and retaining the vacuum within the chamber 102. A metal bellows or other similar flexible seal may be used for the seal 164. An alternative embodiment of the drive assembly 811 is shown in FIG. 8.

Now referring to FIG. 1D, an example boom drive system 148 will be described in detail. The boom drive system 148 may include drive components such as pulleys and belts that are configured and adapted to couple the various drive shafts described above to the first forearm 118, second forearm 120, first wrist member 124, and second wrist member 130. The drive components may include a first forearm drive member 165 that is coupled to the second drive shaft 144, a first forearm driven member 168 that is coupled to the first forearm 118 and a first forearm transmission member 170 coupled between the first forearm drive member 165 and the first forearm driven member 168. Rotation of the second drive shaft 144 therefore rotates the first forearm 118. Each of the first forearm drive member 165 and first forearm driven member 168 may be mounted by bearings to a rigid web portion 171 of the boom 104.

The boom drive system 148 may include a first wrist drive member 172 and a first wrist driven member 174. The first wrist drive member 172 is coupled to the third drive shaft 150 and the first wrist driven member 174 is coupled to the first wrist member 124. A first wrist transmission member 173 couples the first wrist drive member 172 to the first wrist driven member 174 above the web portion 171. Coupling to the first wrist member 124 is provided by a first intermediate transmission member 175 coupling the first wrist driven member 174 to the first wrist member 124 through the first forearm 118. The first wrist transmission member 175 may coupled to the first wrist member 124 below the wrist spacer 135. The first wrist member 124 may be rotatable about the first wrist axis 126 via bearings mounted in the wrist spacer 135. Wrist spacer 135 functions to suitably space the first end effector 128 above the second end effector 134.

Again referring to FIG. 1D, the boom drive system 148 may include drive components such as pulleys and belts that are adapted to drive the second forearm 120. The drive components may include a second forearm drive member 176 that is coupled to the fourth drive shaft 158, a second forearm driven member 178 that is coupled to the second forearm 120 and a second forearm transmission member 180 coupled between the second forearm drive member 176 and the second forearm driven member 178. Rotation of the fourth drive shaft 158 therefore rotates the second forearm 120. Each of the second forearm drive member 176 and second forearm driven member 178 may be mounted by bearings to a rigid web portion 171 of the boom 104.

Figure 7:
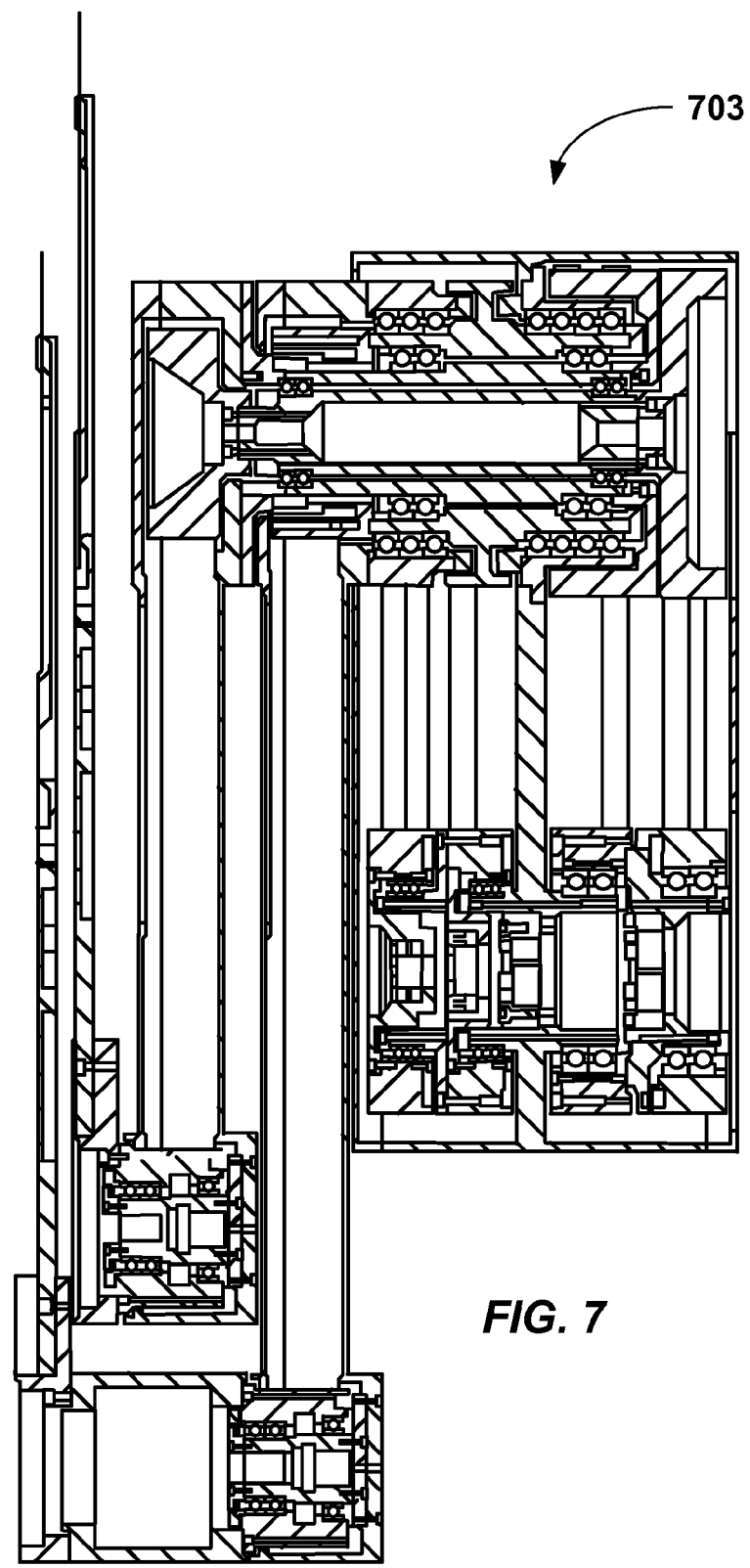
FIG. 7 illustrates a cross-sectioned side view of another multi-axis robot apparatus according to some embodiments.

The boom drive system 148 may include a second wrist drive member 182 and a second wrist driven member 184. The second wrist drive member 182 is coupled to the fifth drive shaft 154 and the second wrist driven member 184 is coupled to the second wrist member 130. A second wrist transmission member 186 couples the second wrist drive member 182 to the second wrist driven member 184 below the web portion 171. Coupling to the second wrist member 130 is provided by a second intermediate transmission member 188 coupling the second wrist driven member 184 to the second wrist member 130 through the second forearm 120. The second wrist member 130 may be rotatable about the second wrist axis 132 via bearings mounted in an outer end location of the second forearm 120. An alternative embodiment of the boom drive system 703 is shown in FIG. 7.

Figure 3A:
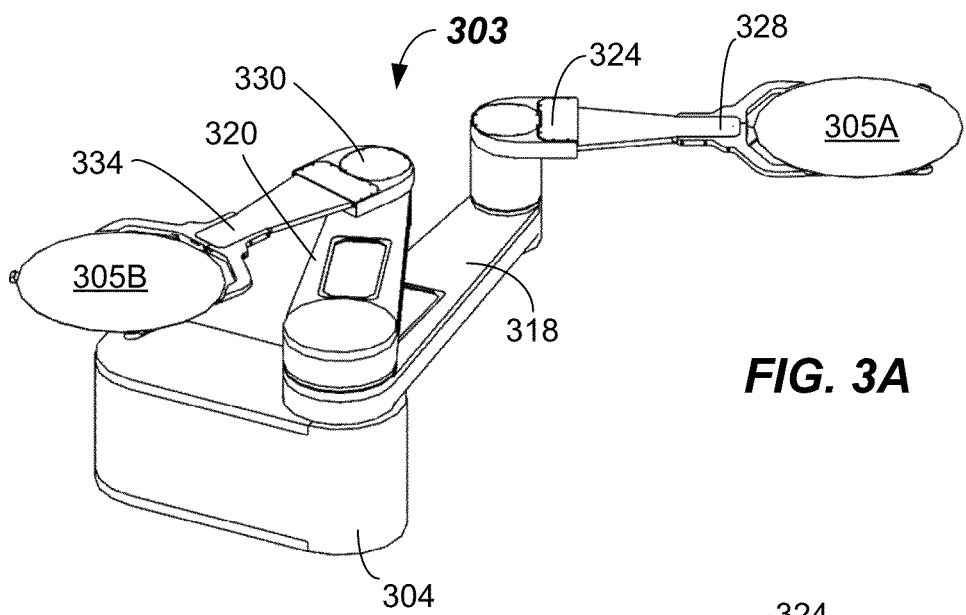
FIGS. 3A and 3B illustrate isometric views of a multi-axis robot apparatus including unequal length forearms provided in different configurations according to some embodiments.
Figure 3B:
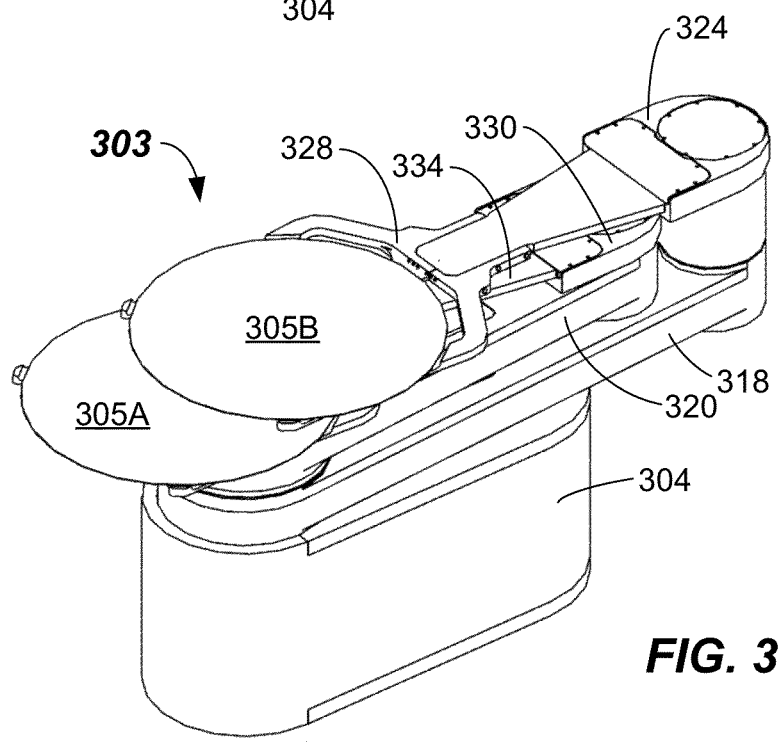

FIGS. 3A-3B illustrate another robot apparatus 303 according to embodiments that may be adapted for use within an electronic device processing system 100. One example robot apparatus 303 is shown in FIG. 3A where the robot apparatus 303 may include independently rotatable boom 304, independently rotatable first and second forearms 318, 320, and independently rotatable first and second wrist members 324, 330 that are shown in one configuration adapted to insert the first end effector 328 carrying a substrate 305A into a chamber (not shown), while a second end effector 334 carrying a second substrate 305B may be prepositioned adjacent to another chamber.

FIG. 3B illustrates the robot apparatus 303 in a folded condition. Note that in the folded condition, the system can be configured such that the substrates 305A, 305B being transported concurrently, do not lie or pass directly above one another. In other words, the centers of the substrates may be sufficiently horizontally offset when the forearms 318, 320, wrist members 324, 330, and end effectors 328, 334 are vertically aligned so that one substrate (e.g., substrate 305A) is not above (or does not pass above) the other substrate (e.g., substrate 305B). This may reduce particle contamination of the lower substrate 305A. However, other configurations are possible.

Figure 3C:
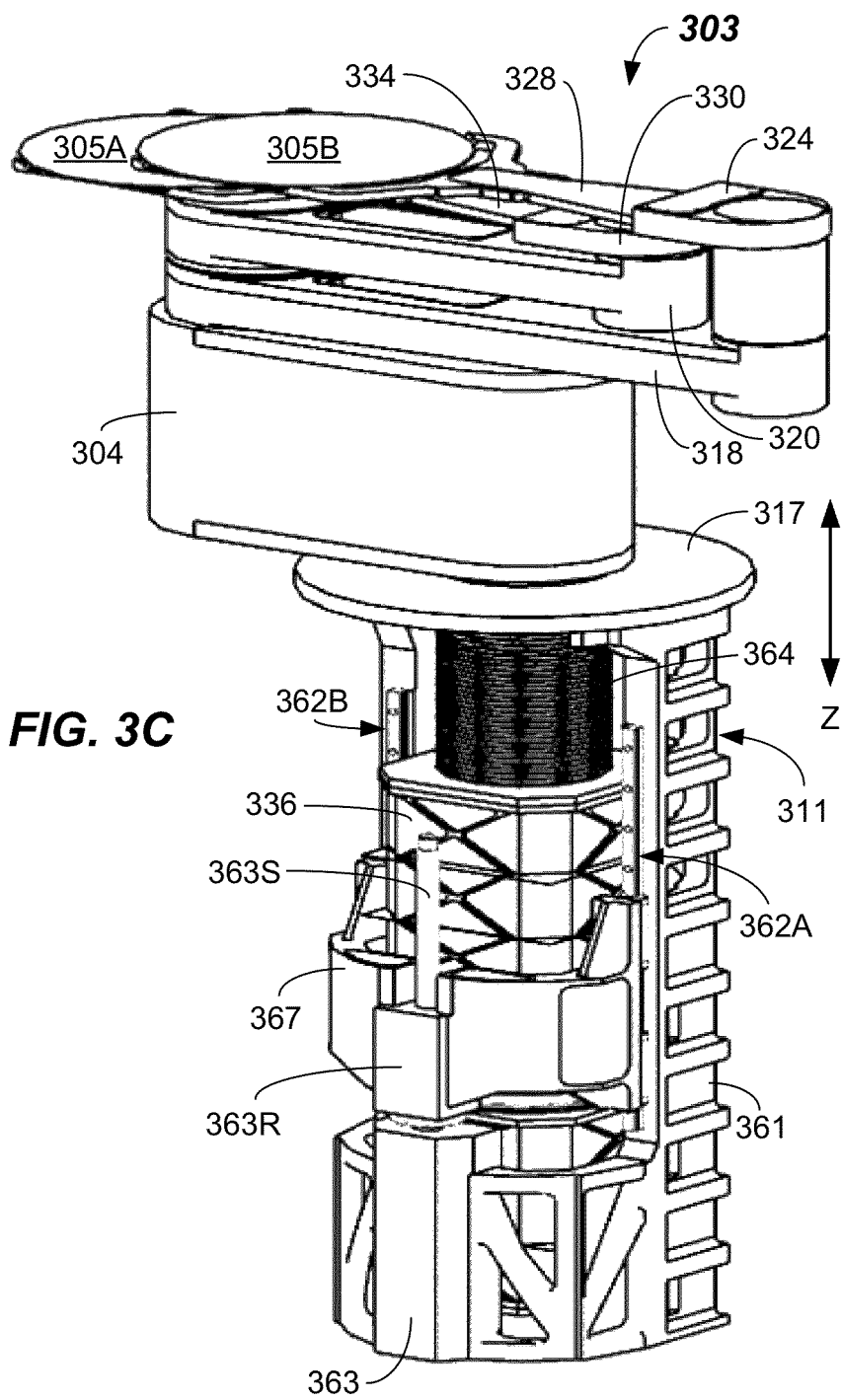
FIG. 3C illustrates an isometric view of a multi-axis robot apparatus including unequal length forearms according to some embodiments.

FIG. 3C illustrates the robot apparatus 303 in a folded condition. The robot apparatus 303 includes a drive assembly 311 having a motor housing 336 containing drive motors like drive motors 140, 146, 152, 156, and 160 (FIG. 1E) and an outer casing 361. Vertical Z-axis capability is provided that lifts the boom 304 and connected components, and, thus, the substrates 305A, 305B. In operation, the motor housing 336 may be restrained from rotation relative to an outer casing 361 by one or more motion restrictor 362A, 362B. Motion restrictors 362A, 362B may be two or more vertically oriented linear slide mechanisms coupled to a carriage 367. The carriage 367 is secured to the motor housing or integral therewith. The motion restrictors 362A, 362B function to constrain rotation of the motor housing 336 relative to the outer casing 361, yet allow Z-axis motion of the motor housing 336. The vertical motion is provided by a vertical motor 363 coupled to the outer casing 361. Rotation of the vertical motor 363 rotates a lead screw 363S in a receiver 363R coupled to or integral with the carriage 367 or motor housing 336. This vertically translates the motor housing 336, and thus the connected boom 304, forearms 318, 320, wrist members 324, 330, end effectors 328, 334, and, thus, the substrates 305A, 305B. A suitable seal 364 may seal between the motor housing 336 and the base 317 thereby accommodating the vertical motion and retaining a vacuum within the chamber the robot 303 is operative in. A metal bellows or other like flexible seal may be used for the seal 364.

Figure 4:
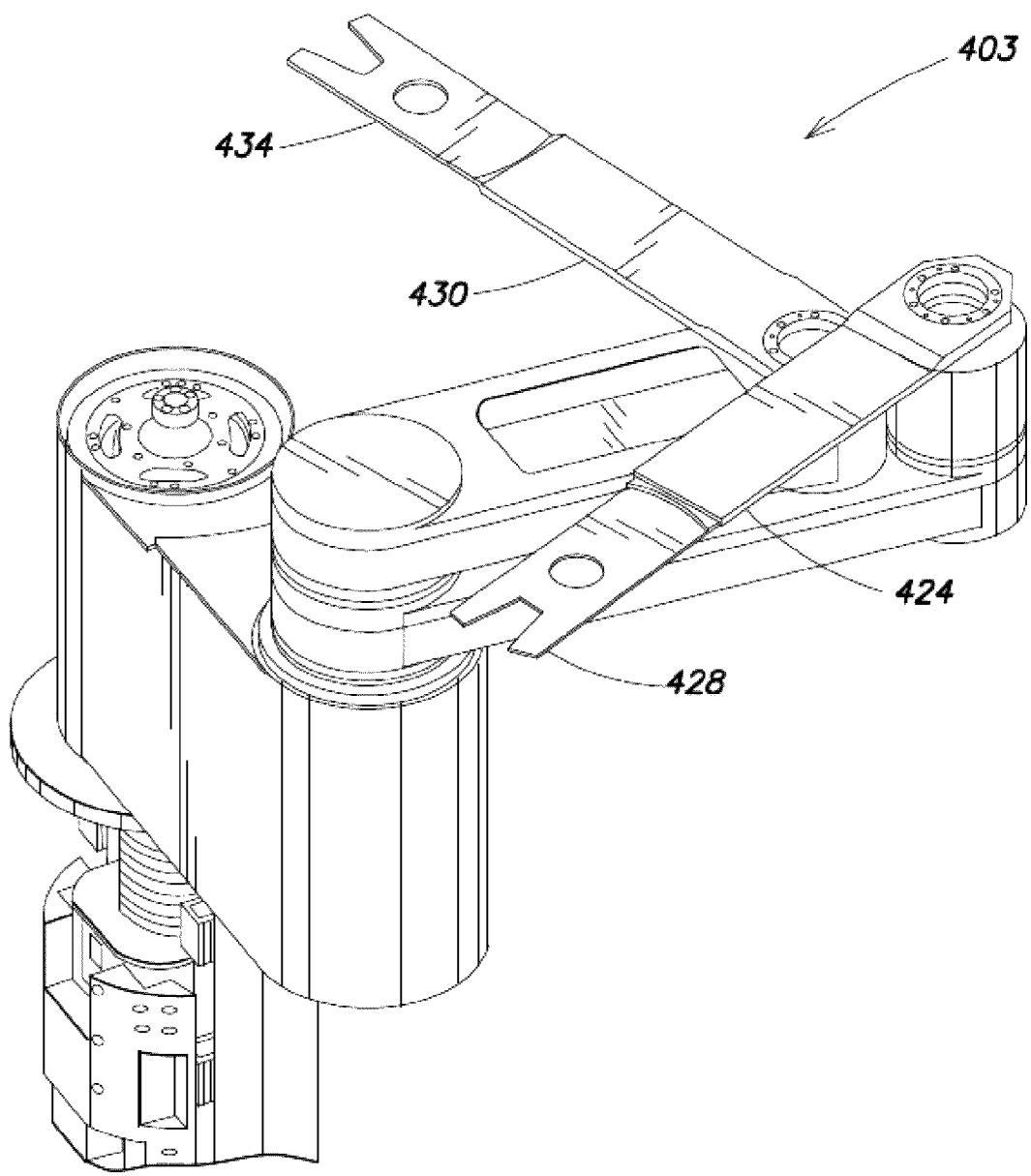
FIG. 4 illustrates an isometric view of another multi-axis robot apparatus according to some embodiments.

FIG. 4 illustrates another robot apparatus 403 according to embodiments that may be adapted for use within an electronic device processing system 100. The robot apparatus 403 includes a different configuration of end effectors 428, 434 and wrist members 424, 430, but otherwise is as described in the FIG. 1B-1E embodiment.

Figure 5:
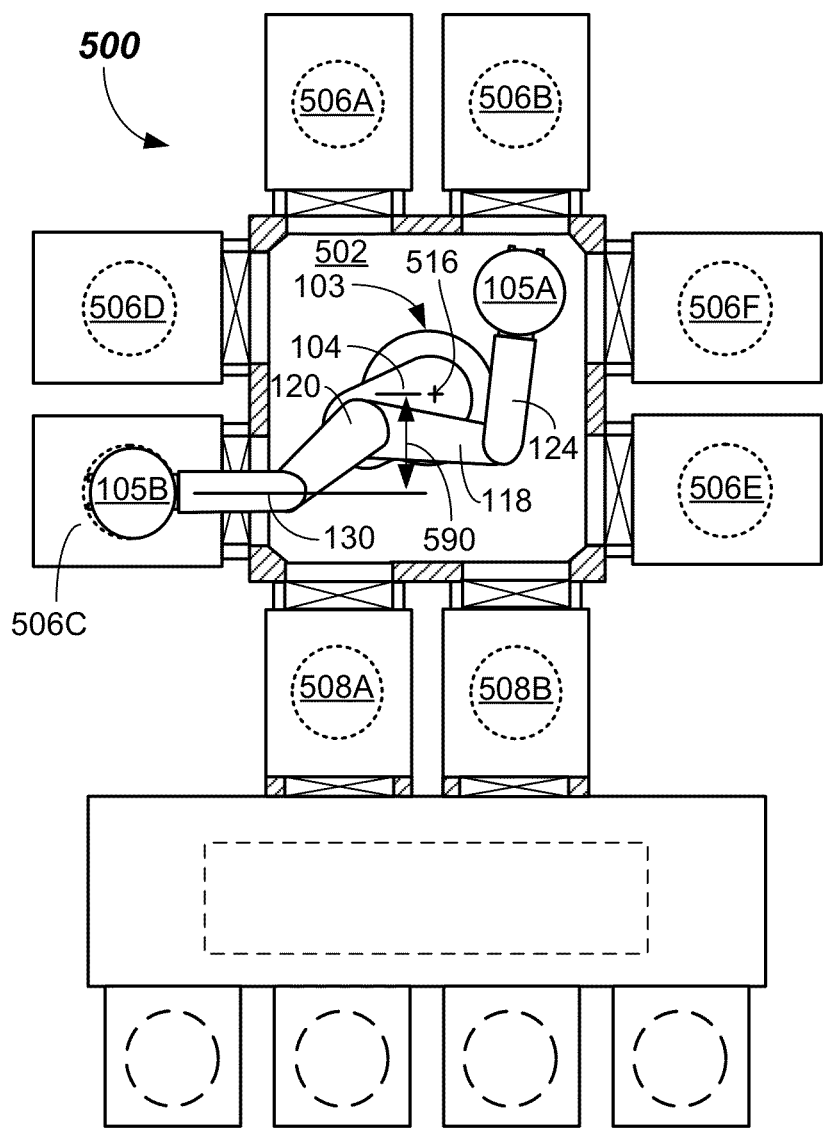
FIG. 5 illustrates a cross-sectioned top view of a multi-axis robot apparatus servicing a mainframe housing having axially-offset chambers according to some embodiments.

Now referring to FIG. 5, another system 500 including the robot apparatus of FIGS. 1B-1E is provided. In operation, the boom 104 may be first rotated about the first rotational axis to place the outboard end boom 104 adjacent to a first destination, i.e., at a position where the robot apparatus 103 may readily access the destination. The robot apparatus 103 may then be actuated to pick up a substrate 105A from the destination (e.g., process chamber 506C) with one end effector, and then to place another substrate 105B at the destination (e.g., process chamber 506C) with the other end effector of the robot apparatus 103 thus carrying out a swap. As the first substrate is removed, the forearm and wrist member may immediately be moved thus carrying out a preposition move so that the substrate 105A is placed next to a second destination (e.g., process chamber 506B). At this second destination, the robot apparatus 103 may carry out another complete substrate swap with the end effectors in the same manner as described for process chamber 506C. In other embodiment, the forearm and wrist member may immediately be moved thus moving the substrate 105A directly to and placing the substrate 105A directly into a load lock chamber 508A or 508B, for example. Accordingly, parallel-faceted process chamber pairs (e.g., 506A and 506B; 506C and 506D; and 506E and 506F) as well as parallel-faceted load lock chamber pairs (e.g., 508A and 506B) may be serviced by the robot apparatus 103, and swaps may be carried out more efficiently because of the combination of the independently moveable boom 104, independently moveable forearms 118, 120, and independently moveable wrist members 124, 130 with one forearm (e.g., forearm 120) being shorter than the other forearm (e.g., forearm 118).

Figure 6:
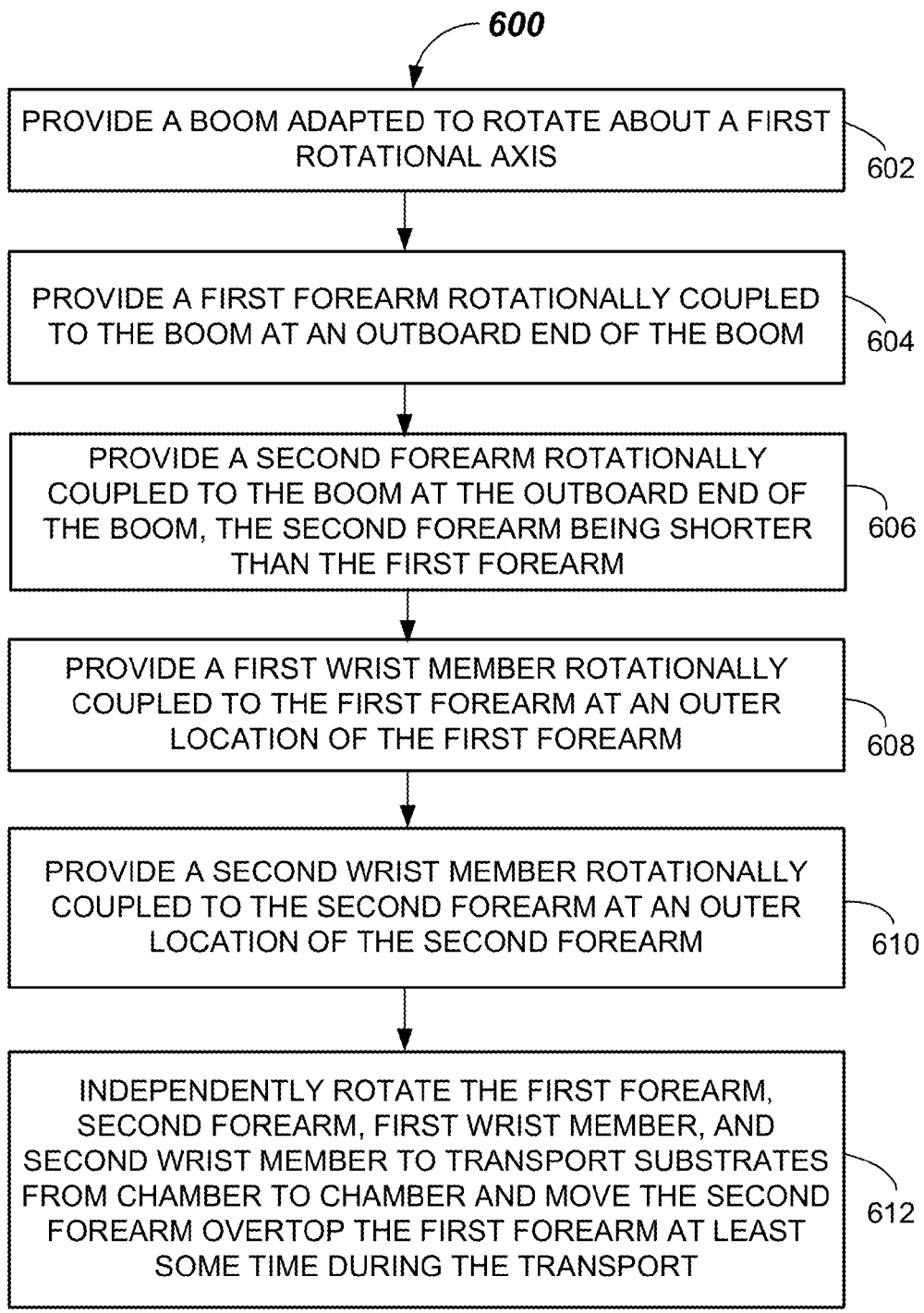
FIG. 6 is a flowchart depicting a method of transporting substrates within an electronic device processing system according to some embodiments.

A method 600 of transporting substrates (e.g., 105A, 105B) within an electronic device processing system (e.g., 100, 200A, 200B, 500) according to embodiments of the present invention is provided in FIG. 6. The method 600 includes providing a boom (e.g., boom 104) adapted to rotate about a first rotational axis (e.g., first rotational axis 116) (602). Boom 104 may have a center-to center length d1. Method 600 includes providing a first forearm (e.g., first forearm 118) rotationally coupled to the boom at an outboard end of the boom (604). Outboard end is spaced from the first rotational axis 116. The method 600 includes providing a second forearm (e.g., second forearm 120) rotationally coupled to the boom at the outboard end of the boom (606), the second forearm being shorter than the first forearm. The length should be sufficiently shorter such that the second forearm 120 may pass by the wrist joint connecting a first wrist member (e.g., first wrist member 124) to the first forearm (e.g., first forearm 118). The method 600 includes providing the first wrist member rotationally coupled to the first forearm at an outer location of the first forearm (608), and providing a second wrist member (e.g., second wrist member 130) rotationally coupled to the second forearm at an outer location of the second forearm (610). Each of 602 through 610 may be completed by an assembly operation where the various components are assembled. The method 600 may be carried out in any order. The method 600 further includes independently rotating the first forearm, second forearm, first wrist member, and second wrist member to transport substrates (e.g., substrates 105A, 105B) from chamber to chamber and moving the second forearm overtop the first forearm at least some time during the transport (612). The movement of the second forearm (e.g., second forearm 120) overtop the first forearm (e.g., first forearm 118) by virtue of the shorter length and clearance with the wrist joint (e.g., clearance with spacer 135) allows rapid and varied motion path capabilities.

In another aspect, prepositioning of a removed substrate (e.g., substrate 105A) adjacent to another chamber (e.g., process chamber or load lock chamber) may be accomplished. For example, a second substrate (e.g., 105B) may be placed into a first chamber (e.g., 506C) while prepositioning a first substrate (e.g., 105A) previously removed from the first chamber at a location adjacent to a second chamber (e.g., chamber 506B). In another aspect, a chamber (e.g., chamber 506C) may be serviced even though the chamber 506C is axially-offset by an offset distance 590 from the first rotational axis (e.g., first rotational axis 516-FIG. 5). In this manner, the substrate (e.g., substrates 105B) can be inserted into the chamber 506C perpendicular to the facet even though the line of entry is not aligned with the first rotational axis. This allows rectangular or square-shaped transfer chambers (e.g., transfer chamber 502) having multiple process chambers on each side to be serviced. In another aspect, swapping a first substrate (e.g., 105A) with a second substrate (e.g., 105B) at a chamber (e.g., 105B) can be carried out in a manner by independently rotating the first forearm 118, first wrist member 124, second forearm 120, and second wrist member 130 such that during a swap motion profile, the second substrate 105B is never positioned vertically underneath the first substrate 105A. This may avoid contamination of the second substrate 105B.

The foregoing description discloses only example embodiments of the invention. Modifications of the above-disclosed apparatus, systems and methods which fall within the scope of the invention will be readily apparent to those of ordinary skill in the art. Accordingly, while the present invention has been disclosed in connection with example embodiments, it should be understood that other embodiments may fall within the scope of the invention, as defined by the following claims.

The invention claimed is:

1. A multi-axis robot, comprising:
   a boom adapted to rotate about a first rotational axis, the boom including a web portion;
   a boom drive apparatus including:
      a first forearm drive member rotationally mounted to the boom above the web portion,
      a first wrist drive member rotationally mounted to the boom above the web portion,
      a second forearm drive member rotationally mounted to the boom below the web portion,
      a second wrist drive member rotationally mounted to the boom below the web portion;
   a first forearm rotationally coupled to the boom at an outboard end of the boom and the first forearm is configured to be independently rotated about a second rotational axis;
   a second forearm rotationally coupled to the boom at the outboard end of the boom and configured to be independently rotated about the second rotational axis, the second forearm being shorter than the first forearm;
   a first wrist member rotationally coupled to the first forearm at a first outer location of the first forearm and configured to be independently rotated relative to the first forearm about a third axis; and
   a second wrist member rotationally coupled to the second forearm at the second outer location and configured to be independently rotated relative to the second forearm about a fourth axis.

2. The multi-axis robot of claim 1, comprising:
   a first drive motor coupled to the boom;
   a second drive motor coupled to the first forearm;
   a third drive motor coupled to the first wrist member;
   a fourth drive motor coupled to the second forearm; and
   a fifth drive motor coupled to the second wrist member.

3. The multi-axis robot of claim 1, comprising:
   a first stator of a first drive motor;
   a second stator of a second drive motor;
   a third stator of a third drive motor;
   a fourth stator of a fourth drive motor;
   a fifth stator of a fifth drive motor;
   an upper bulkhead supporting the first and fifth stators;
   a lower bulkhead supporting the second and third stators; and
   the fourth stator being received between an upper bulkhead and a lower bulkhead.

4. The multi-axis robot of claim 1, wherein the second forearm has a length shorter than the first forearm and configured such that the second forearm does not interfere with a wrist joint of the first forearm.

5. The multi-axis robot of claim 1, wherein the first forearm has a first center-to-center length, and the second forearm has a second center-to-center length, and the second center-to-center length is between 50% and 90% of the first center-to-center length.

6. The multi-axis robot of claim 1, wherein a center-to-center length of the boom is shorter than a center-to-center length of the first forearm.

7. The multi-axis robot of claim 1, wherein a center-to-center length of the boom is shorter than a center-to-center length of the second forearm.

8. The multi-axis robot of claim 1, wherein the second forearm being shorter is positioned at a higher level than the first forearm.

9. The multi-axis robot of claim 1,
   a first forearm driven member rotationally mounted to the boom at an outboard end above the web portion,
   a first wrist driven member rotationally mounted to the boom at an outboard end above the web portion,
   a first forearm transmission member coupling the first forearm drive member to the first forearm driven member above the web portion, and
   a first wrist transmission member coupling the first wrist drive member to the first wrist driven member above the web portion.

10. The multi-axis robot of claim 9, comprising a first intermediate transmission member coupled between the first wrist drive member and the first wrist member.

11. The multi-axis robot of claim 9, wherein the boom drive apparatus comprises:

second forearm driven member rotationally mounted to the boom at an outboard end below the web portion,
a second wrist driven member rotationally mounted to the boom at an outboard end below the web portion,
a second forearm transmission member coupling the second forearm drive member to the second forearm driven member below the web portion, and
a second wrist transmission member coupling the second wrist drive member to the second wrist driven member below the web portion.

12. The multi-axis robot of claim 11, comprising a second intermediate transmission member coupled between the second wrist drive member and the second wrist member.

13. An electronic device processing system, comprising:
a transfer chamber;
a multi-link robot apparatus at least partially received in the transfer chamber, the multi-link robot apparatus having a boom adapted to rotate about a first rotational axis, the boom including a web portion;
a boom drive apparatus including:
 a first forearm drive member rotationally mounted to the boom above the web portion,
 a first wrist drive member rotationally mounted to the boom above the web portion,
 a second forearm drive member rotationally mounted to the boom below the web portion,
 a second wrist drive member rotationally mounted to the boom below the web portion;
a first forearm rotationally coupled to the boom at an outboard end of the boom and configured to be independently rotated;
a second forearm rotationally coupled to the boom at the outboard end of the boom and configured to be independently rotated, the second forearm being shorter than the first forearm;
a first wrist member rotationally coupled to the first forearm and configured to be independently rotated relative to the first forearm; and
a second wrist member rotationally coupled to the second forearm and configured to be independently rotated relative to the second forearm.

14. The electronic device processing system of claim 13, comprising:
a first center-to-center length of the first forearm, a second center-to-center length of the second forearm, and the second center-to center length is between 50% and 90% of the first center-to center length.

15. A method of transporting substrates within an electronic device processing system, comprising:
providing a boom adapted to rotate about a first rotational axis, the boom including a web portion;
providing a boom drive apparatus including:
 a first forearm drive member rotationally mounted to the boom above the web portion,
 a first wrist drive member rotationally mounted to the boom above the web portion,
 a second forearm drive member rotationally mounted to the boom below the web portion,
 a second wrist drive member rotationally mounted to the boom below the web portion;
providing a first forearm rotationally coupled to the boom at an outboard end of the boom;
providing a second forearm rotationally coupled to the boom at the outboard end of the boom, the second forearm being shorter than the first forearm;
providing a first wrist member rotationally coupled to the first forearm at an outer location of the first forearm;
providing a second wrist member rotationally coupled to the second forearm at an outer location of the second forearm; and
independently rotating the first forearm via rotation of the first forearm drive member, independently rotating the second forearm via rotation of the second forearm drive member, independently rotating the first wrist member via rotation of the first wrist drive member, and independently rotating the second wrist member via rotation of the second wrist drive member to transport substrates from chamber to chamber and moving the second forearm overtop the first forearm at least some time during the transport.

16. The method of claim 15 including rotating the first forearm and first wrist member to preposition a first end effector at a position adjacent to a process chamber.

17. The method of claim 16 including inserting a second end effector coupled to the second wrist member into a process chamber along a line of entry that is offset from the first rotational axis.

18. The method of claim 17 including positioning the first forearm, second forearm, first wrist member, second wrist member, first end effector, and second end effector in a folded condition wherein the first substrate and the second substrate being transported concurrently do not pass over each other.

19. The method of claim 15 including swapping a first substrate with a second substrate at a chamber wherein during the swap motion profile, the second substrate is never positioned vertically underneath the first substrate.

20. The method of claim 15 including placing a second substrate into a first chamber while prepositioning a first substrate previously removed from the first chamber adjacent to a second chamber.

* * * * *